(12) United States Patent
Chung et al.

(10) Patent No.: US 10,892,263 B2
(45) Date of Patent: Jan. 12, 2021

(54) METHODS OF FABRICATING SEMICONDUCTOR DEVICE

(71) Applicant: Samsung Electronics Co., Ltd., Suwon-si (KR)

(72) Inventors: Hoi Sung Chung, Suwon-si (KR); Tae Sung Kang, Seoul (KR); Dong Suk Shin, Yongin-si (KR); Kong Soo Lee, Hwaseong-si (KR); Jun-Won Lee, Asan-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/270,865

(22) Filed: Feb. 8, 2019

(65) Prior Publication Data

US 2019/0386008 A1    Dec. 19, 2019

(30) Foreign Application Priority Data

Jun. 15, 2018    (KR) .......................... 10-2018-0068798

(51) Int. Cl.
*H01L 21/336*    (2006.01)
*H01L 27/092*    (2006.01)
(Continued)

(52) U.S. Cl.
CPC .... *H01L 27/10873* (2013.01); *H01L 21/0217* (2013.01); *H01L 21/02164* (2013.01); *H01L 21/02667* (2013.01); *H01L 21/266* (2013.01); *H01L 21/26513* (2013.01); *H01L 21/31111* (2013.01); *H01L 21/324* (2013.01); *H01L 21/76897* (2013.01); *H01L 27/10855* (2013.01); *H01L 29/0847* (2013.01); *H01L 29/401* (2013.01); *H01L 29/518* (2013.01);
(Continued)

(58) Field of Classification Search
CPC ......... H01L 21/823807; H01L 29/6659; H01L 29/6653; H01L 29/7833; H01L 21/02667; H01L 27/108
See application file for complete search history.

(56) References Cited

U.S. PATENT DOCUMENTS 6,020,232 A * 2/2000 Gardner .......... H01L 21/823425
257/E21.62
6,472,283 B1 * 10/2002 Ishida ................. H01L 29/6653
438/230
(Continued)

*Primary Examiner* — Bradley Smith
*Assistant Examiner* — David J Goodwin
(74) *Attorney, Agent, or Firm* — Myers Bigel, P.A.

(57) ABSTRACT

Methods of fabricating a semiconductor device are provided. The methods may include forming a gate structure on a core-peri region of a substrate. The substrate may further include a cell region. The methods may also include forming a gate spacer on a sidewall of the gate structure, forming a first impurity region adjacent the gate spacer in the core-peri region of the substrate by performing a first ion implantation process, removing the gate spacer, forming a second impurity region in the core-peri region of the substrate between the gate structure and the first impurity region by performing a second ion implantation process, forming a stress film on the gate structure, an upper surface of the first impurity region, and an upper surface of the second impurity region, and forming a recrystallization region by crystallizing the first impurity region and the second impurity region by performing an annealing process.

20 Claims, 19 Drawing Sheets

(51) Int. Cl.
*H01L 21/8238* (2006.01)
*H01L 29/78* (2006.01)
*H01L 27/108* (2006.01)
*H01L 21/265* (2006.01)
*H01L 29/66* (2006.01)
*H01L 21/02* (2006.01)
*H01L 21/768* (2006.01)
*H01L 29/51* (2006.01)
*H01L 21/311* (2006.01)
*H01L 21/324* (2006.01)
*H01L 29/08* (2006.01)
*H01L 29/40* (2006.01)
*H01L 21/266* (2006.01)
*H01L 29/04* (2006.01)

(52) U.S. Cl.
CPC ...... *H01L 29/6653* (2013.01); *H01L 29/6656* (2013.01); *H01L 29/045* (2013.01)

(56) References Cited

U.S. PATENT DOCUMENTS

| | | |
|---|---|---|
| 7,341,902 B2 | 3/2008 | Anderson et al. |
| 7,388,267 B1 | 6/2008 | Chen et al. |
| 7,547,596 B2 | 6/2009 | Visokay et al. |
| 7,592,270 B2 | 9/2009 | Teo et al. |
| 7,678,636 B2 | 3/2010 | Chuang et al. |
| 7,678,637 B2 | 3/2010 | Nandakumar et al. |
| 7,678,662 B2 | 3/2010 | Arghavani et al. |
| 7,682,917 B2 | 3/2010 | Bedell et al. |
| 7,750,416 B2 | 7/2010 | Lee et al. |
| 7,759,207 B2 | 7/2010 | Quek et al. |
| 7,767,534 B2 | 8/2010 | Yang et al. |
| 7,785,949 B2 | 8/2010 | Chen |
| 7,785,950 B2 | 8/2010 | Fang et al. |
| 7,790,537 B2 | 9/2010 | Wei et al. |
| 7,834,399 B2 | 11/2010 | Kanarsky et al. |
| 7,843,013 B2 | 11/2010 | Nakagawa et al. |
| 7,858,482 B2 | 12/2010 | Zhang et al. |
| 7,897,451 B2 | 3/2011 | Wiatr et al. |
| 7,906,385 B2 | 3/2011 | Lenski et al. |
| 7,932,144 B2 | 4/2011 | Liu et al. |
| 7,964,458 B2 | 6/2011 | Wirbeleit et al. |
| 7,964,894 B2 | 6/2011 | Quek et al. |
| 7,968,915 B2 | 6/2011 | Kanarsky et al. |
| 7,977,202 B2 | 7/2011 | Chuang et al. |
| 7,981,750 B2 | 7/2011 | Baik et al. |
| 7,985,652 B2 | 7/2011 | Ke et al. |
| 8,067,281 B1 | 11/2011 | Chen et al. |
| 8,067,282 B2 | 11/2011 | Chu et al. |
| 8,101,476 B2 | 1/2012 | Garg et al. |
| 8,101,480 B1 | 1/2012 | Kim et al. |
| 8,114,727 B2 | 2/2012 | Xiong et al. |
| 8,119,541 B2 | 2/2012 | Teo et al. |
| 8,125,035 B2 | 2/2012 | Nandakumar et al. |
| 8,129,236 B2 | 3/2012 | Gehring et al. |
| 8,143,133 B2 | 3/2012 | Hoentschel et al. |
| 8,154,084 B2 | 4/2012 | Hoentschel et al. |
| 8,158,472 B2 | 4/2012 | Miyashita |
| 8,324,690 B2 | 12/2012 | Chen |
| 8,338,239 B2 | 12/2012 | Chang et al. |
| 8,338,885 B2 | 12/2012 | Hoentschel et al. |
| 8,394,684 B2 | 3/2013 | Kanakasabapathy et al. |
| 8,426,266 B2 | 4/2013 | Hoentschel et al. |
| 8,435,848 B2 | 5/2013 | Mehrotra |
| 8,470,707 B2 | 6/2013 | Xiong et al. |
| 8,497,197 B2 | 7/2013 | Zhu et al. |
| 8,535,999 B2 | 9/2013 | Adam et al. |
| 8,551,845 B2 | 10/2013 | Chan et al. |
| 8,558,310 B2 | 10/2013 | Nandakumar et al. |
| 8,633,078 B2 | 1/2014 | Lim et al. |
| 8,659,112 B2 | 2/2014 | Nandakumar et al. |
| 8,664,054 B2 | 3/2014 | Zhu et al. |
| 8,679,924 B2 | 3/2014 | Wei et al. |
| 8,686,506 B2 | 4/2014 | Chang et al. |
| 8,691,644 B2 | 4/2014 | Song et al. |
| 8,735,255 B2 | 5/2014 | Hsiao et al. |
| 8,753,969 B2 | 6/2014 | Flachowsky et al. |
| 8,772,095 B2 | 7/2014 | Kim et al. |
| 8,772,120 B2 | 7/2014 | Chang et al. |
| 8,772,878 B2 | 7/2014 | Hoentschel et al. |
| 8,853,042 B2 | 10/2014 | Nandakumar et al. |
| 8,871,587 B2 | 10/2014 | McMullan et al. |
| 8,889,540 B2 | 11/2014 | Basker et al. |
| 8,890,255 B2 | 11/2014 | Kanakasabapathy et al. |
| 8,962,419 B2 | 2/2015 | McMullan et al. |
| 8,969,151 B2 | 3/2015 | Tan et al. |
| 8,987,099 B2 | 3/2015 | Tsai et al. |
| 9,054,188 B2 | 6/2015 | Chang et al. |
| 9,059,210 B2 | 6/2015 | Li |
| 9,059,285 B2 | 6/2015 | Chan et al. |
| 9,117,929 B2 | 8/2015 | Wirbeleit et al. |
| 9,142,507 B1 | 9/2015 | Shroff et al. |
| 9,202,913 B2 | 12/2015 | Zhu |
| 9,231,079 B1 | 1/2016 | Van Meer et al. |
| 9,252,271 B2 | 2/2016 | Lu et al. |
| 9,368,627 B2 | 6/2016 | Liu et al. |
| 9,419,136 B2 | 8/2016 | Yu et al. |
| 9,419,137 B1 | 8/2016 | Bello et al. |
| 9,431,521 B1 | 8/2016 | Cheng et al. |
| 9,455,252 B2 | 9/2016 | Nandakumar |
| 9,502,558 B2 | 11/2016 | Reboh et al. |
| 9,502,559 B2 | 11/2016 | Yu et al. |
| 9,559,166 B2 | 1/2017 | Ray et al. |
| 9,570,587 B2 | 2/2017 | Lo et al. |
| 9,646,838 B2 | 5/2017 | Thurmer et al. |
| 9,653,581 B2 | 5/2017 | Lu et al. |
| 9,660,077 B2 | 5/2017 | Cheng et al. |
| 9,680,019 B1 | 6/2017 | Utomo et al. |
| 9,711,619 B1 | 7/2017 | Peng et al. |
| 9,741,853 B2 | 8/2017 | Sinha et al. |
| 9,761,717 B2 | 9/2017 | Cheng et al. |
| 9,768,277 B2 | 9/2017 | Cheng et al. |
| 9,892,973 B2 | 2/2018 | Cheng et al. |
| 9,899,517 B2 | 2/2018 | Yu et al. |
| 9,905,673 B2 | 2/2018 | Peng et al. |
| 2007/0141775 A1 | 6/2007 | Teo et al. |
| 2008/0064176 A1* | 3/2008 | Chou ............... H01L 29/6653 438/303 |
| 2009/0142891 A1 | 6/2009 | Kim et al. |
| 2009/0189227 A1 | 7/2009 | Miyashita |
| 2009/0218636 A1* | 9/2009 | Lee ............... H01L 29/66492 257/394 |
| 2009/0289284 A1 | 11/2009 | Goh et al. |
| 2009/0294868 A1 | 12/2009 | Griebenow et al. |
| 2010/0255666 A1 | 10/2010 | Yang et al. |
| 2011/0101506 A1 | 5/2011 | Butt et al. |
| 2012/0070948 A1 | 3/2012 | Cheng et al. |
| 2012/0071004 A1 | 3/2012 | Chen et al. |
| 2012/0175709 A1* | 7/2012 | Cho ............... H01L 21/823425 257/369 |
| 2012/0196422 A1 | 8/2012 | Flachowsky et al. |
| 2012/0309171 A1 | 12/2012 | Lu et al. |
| 2013/0023103 A1 | 1/2013 | Yang et al. |
| 2013/0049091 A1* | 2/2013 | Saino ............... H01L 29/7833 257/310 |
| 2013/0200455 A1 | 8/2013 | Lo et al. |
| 2014/0151762 A1* | 6/2014 | Wang ............... H01L 29/66477 257/288 |
| 2014/0248749 A1 | 9/2014 | Hoentschel et al. |
| 2015/0097197 A1 | 4/2015 | Ganz et al. |
| 2015/0187656 A1 | 7/2015 | Choi et al. |
| 2015/0228788 A1 | 8/2015 | Chen et al. |
| 2015/0270153 A1 | 9/2015 | Chang et al. |
| 2015/0340501 A1 | 11/2015 | Wu et al. |
| 2016/0056268 A1 | 2/2016 | Chin et al. |
| 2017/0154979 A1 | 6/2017 | Lo et al. |
| 2017/0358496 A1 | 12/2017 | Cheng et al. |

* cited by examiner

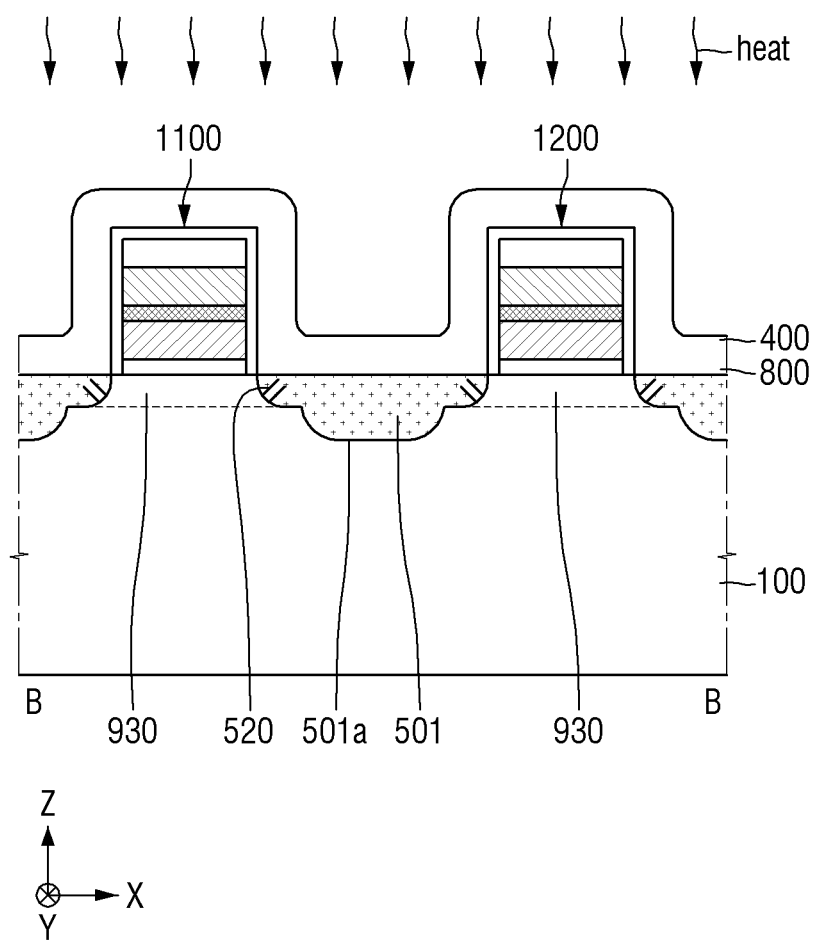

METHODS OF FABRICATING SEMICONDUCTOR DEVICE

CROSS-REFERENCE TO RELATED APPLICATION

This U.S. non-provisional patent application claims priority under 35 U.S.C. § 119 to Korean Patent Application No. 10-2018-0068798, filed on Jun. 15, 2018, in the Korean Intellectual Property Office (KIPO), the disclosure of which is incorporated by reference herein in its entirety.

FIELD

The present disclosure generally relates to the field of electronics and, more particularly, to a method of fabricating a semiconductor device.

BACKGROUND

An integrated circuit device may include millions or billions of transistors therein. Transistors may operate as a switch to allow charge carriers (for example, electrons) to flow when being turned on and to prevent charge carriers from flowing when being turned off. The performance of transistors may be influenced by charge carrier mobility. The charge carrier mobility is a criterion indicating how fast the charge carrier moves with the existence of an electric field. If the charge carrier mobility increases, a higher switching speed of the transistor may be provided with a fixed voltage, or a lower voltage may be applied for the same switching speed.

SUMMARY

Methods of fabricating a semiconductor device according to some embodiments of the present inventive concept may enhance performance by applying stress memorization technique (SMT) to a transistor on a core-peri region of a memory device (e.g., dynamic random access memory (DRAM)).

Methods of fabricating a semiconductor device according to some embodiments of the present inventive concept may enhance performance by reducing a width of a channel region by performing an additional ion implantation process after removing a gate spacer.

According to some embodiments of the present inventive concept, methods of fabricating a semiconductor device may include forming a gate structure on a core-peri region of a substrate. The substrate may further include a cell region. The methods may also include forming a gate spacer on a sidewall of the gate structure, forming a first impurity region adjacent the gate spacer in the core-peri region of the substrate by performing a first ion implantation process, removing the gate spacer, forming a second impurity region in the core-peri region of the substrate between the gate structure and the first impurity region by performing a second ion implantation process, forming a stress film on the gate structure, an upper surface of the first impurity region, and an upper surface of the second impurity region, and forming a recrystallization region by crystallizing the first impurity region and the second impurity region by performing an annealing process.

According to some embodiments of the present inventive concept, methods of fabricating a semiconductor device may include forming a gate structure on a core-peri region of a substrate. The substrate may further include a cell region. The methods may also include forming gate spacers on opposing sidewalls of the gate structure and forming first impurity regions in the core-peri region of the substrate by performing a first ion implantation process. Each of the first impurity regions may be adjacent to a respective one of the gate spacers, the first impurity regions may define a first channel region in the core-peri region of the substrate between the first impurity regions, and the first channel region may have a first width. The methods may further include removing the gate spacers, forming second impurity regions in the core-peri region of the substrate by performing a second ion implantation process, forming a stress film on the gate structure, upper surfaces of the first impurity regions, and upper surfaces of the second impurity regions, and forming a recrystallization region by crystallizing the first impurity regions and the second impurity regions by performing an annealing process. Each of the second impurity regions may be adjacent to a respective one of the opposing sidewalls of the gate structure, the second impurity regions may define a second channel region in the core-peri region of the substrate between the second impurity regions, and the second channel region may have a second width narrower than the first width.

According to some embodiments of the present inventive concept, methods of fabricating a semiconductor device may include forming a first gate structure and a second gate structure on a core-peri region of a substrate. The first gate structure and the second gate structure may be spaced apart from each other in a first direction, and the substrate may further include a cell region. The methods may also include forming a first gate spacer on a sidewall of the first gate structure and forming a second gate spacer on a sidewall of the second gate structure, forming a first impurity region in the core-peri region of the substrate between the first gate spacer and the second gate spacer by performing a first ion implantation process, removing the first gate spacer and the second gate spacer, and forming second impurity regions in a first portion and a second portion of the core-peri region of the substrate by performing a second ion implantation process. The first portion of the core-peri region of the substrate is between the first gate structure and the first impurity region, and the second portion of the core-peri region of the substrate is between the second gate structure and the first impurity region The methods may further include forming a stress film on the first gate structure, the second gate structure, an upper surface of the first impurity region, and upper surfaces of the second impurity regions and forming a recrystallization region by crystallizing the first impurity region and the second impurity regions by performing an annealing process.

The objectives that are intended to be addressed by the present inventive concept are not limited to those mentioned above, and other objectives that are not mentioned above may be clearly understood to those skilled in the art based on the description provided below.

BRIEF DESCRIPTION OF THE DRAWINGS

The above and other objects, features and advantages of the present inventive concept will become more apparent to those of ordinary skill in the art by describing in detail example embodiments thereof with reference to the accompanying drawings, in which:

FIG. 18 and FIG. 19 are cross-sectional views illustrating a method of fabricating a semiconductor device according to some embodiments of the present inventive concept.

DETAILED DESCRIPTION

Hereinafter, with reference to FIG. 1 and FIG. 2, a semiconductor device fabricated by methods according to some embodiments of the present inventive concept will be described.

Figure 1:
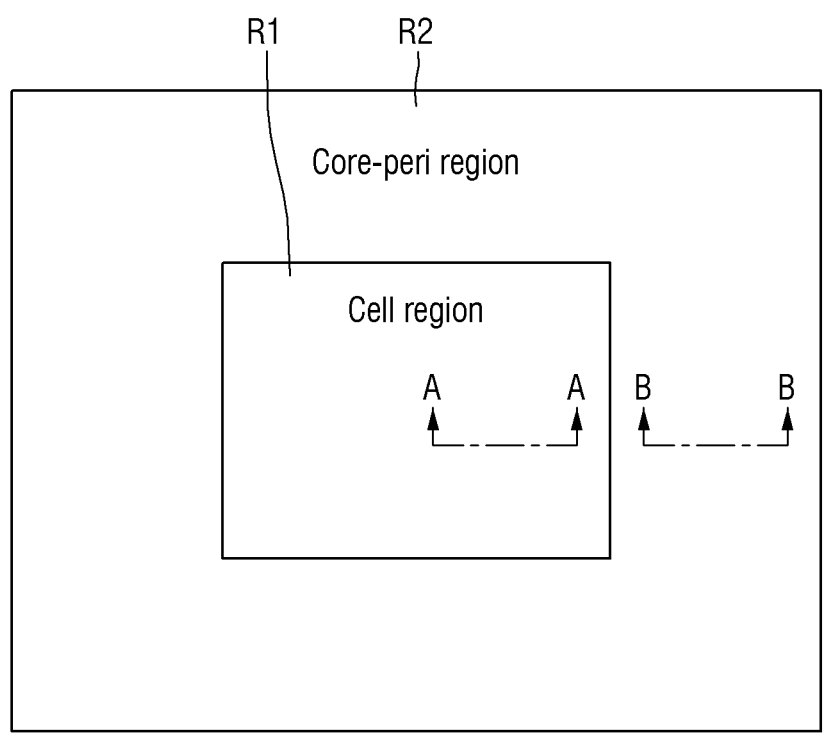
FIG. 1 is a layout of a semiconductor device fabricated by methods according to some embodiments of the present inventive concept.

FIG. 1 is a layout of a semiconductor device fabricated by methods according to some embodiments of the present inventive concept. FIG. 2 is a cross-sectional view taken along the lines A-A and B-B of FIG. 1.

Figure 2:
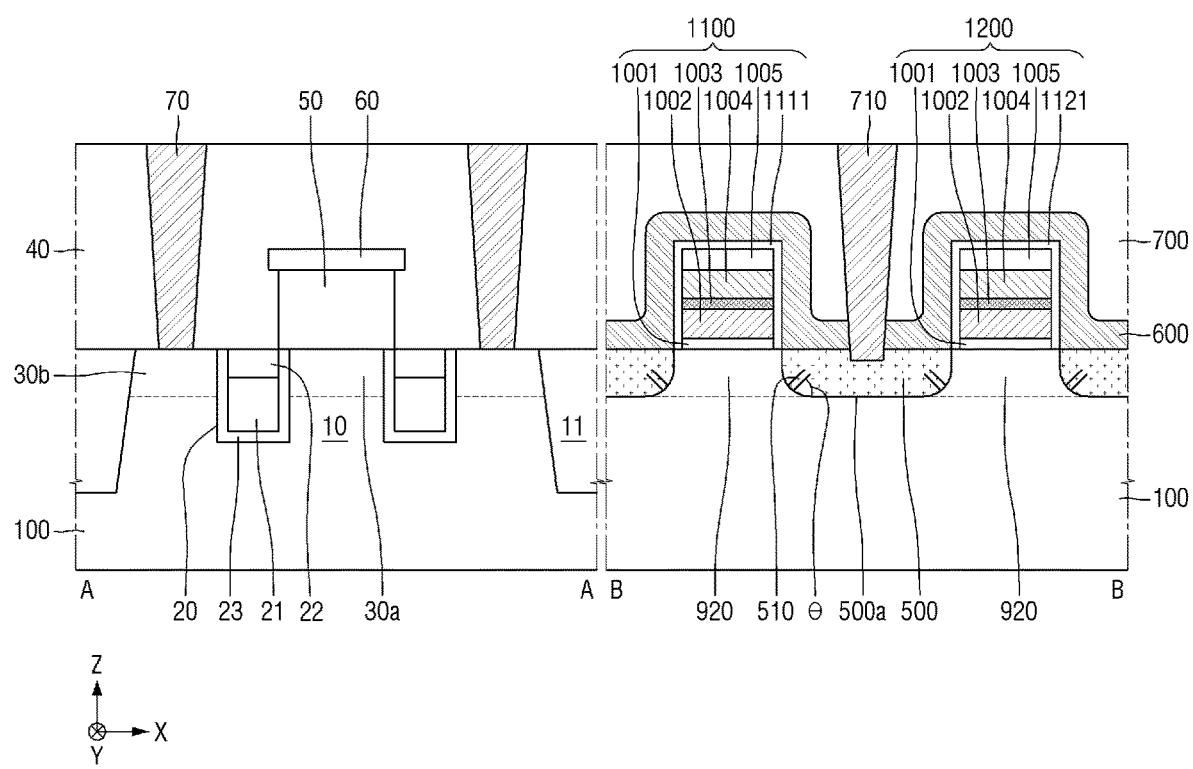
FIG. 2 is a cross-sectional view taken along the lines A-A and B-B of FIG. 1.

Referring to FIG. 1 and FIG. 2, the semiconductor device fabricated by the methods according to some embodiments includes a cell region and a core-peri region. In some embodiments, the core-peri region may be on an edge of the cell region as illustrated in FIG. 1.

The present inventive concept relates to a memory element including any one of a DRAM device, a Flash device, and a PRAM device. In some embodiments, memory cells of, for example, a DRAM device, a Flash device, and a PRAM device, may be on the cell region. Hereinafter, the DRAM will be described as an example. However, the present inventive concept is not limited thereto.

A substrate 100 includes a first region R1 in which the cell region is formed, and a second region R2 in which the core-peri region is formed.

The substrate 100 may be a structure in which a base substrate and an epi-layer are stacked each other, although the present inventive concept is not limited thereto. In some embodiments, the substrate 100 may be any one of a silicon substrate, a gallium arsenide substrate, a silicon germanium substrate, a ceramic substrate, a quartz substrate, or a glass substrate for display, and a semiconductor on insulator (SOI) substrate. Hereinbelow, the silicon substrate will be described as an example. The substrate 100 may have a first conductivity type (for example, P-type conductivity), although the present inventive concept is not limited thereto.

The cell region includes a unit active region 10, an element isolation region 11, a trench 20, a gate electrode 21, a capping pattern 22, a gate insulation film 23, a first source/drain region 30*a*, a second source/drain region 30*b*, an interlayer insulation film 40, a first contact plug 50, a bit line 60, and a second contact plug 70.

The bit line 60 and the gate electrode 21 that is used as a word line may be arranged on the substrate 100. Specifically, the unit active region 10 and the element isolation region 11 may be formed on the substrate 100. In this case, two transistors may be formed in a single unit active region 10.

The two transistors may include two gate electrodes 21 formed to cross the unit active region 10, the first source/drain region 30*a* formed in the unit active region 10 between the two gate electrodes 21, and the second source/drain region 30*b* formed between the gate electrode 21 and the element isolation region 11. In some embodiments, the two transistors share the first source/drain region 30*a* and do not share the second source/drain region 30*b*, as illustrated in FIG. 2.

In some embodiments, the gate insulation film 23 may be formed along a sidewall and a bottom surface of the trench 20 that is formed in the substrate 100. The gate insulation film 23 may include, for example, silicon oxide or a high-k dielectric material with a higher dielectric constant than silicon oxide.

In some embodiments, the gate electrode 21 may not completely fill the trench 20 and may fill a portion (e.g., a lower portion) of the trench 20. That is, the gate electrode 21 may be in a recessed shape.

The gate electrode 21 may be formed by using any one of, for example, a doped poly silicon, titanium nitride (TiN), tantalum nitride (TaN), tungsten nitride (WN), titanium (Ti), tantalum (Ta), and tungsten (W), although the present inventive concept is not limited thereto.

The capping pattern 22 may be formed on the gate electrode 21 to fill in the trench 20 (e.g., an upper portion of the trench 20). The capping pattern 22 may include an insulation material, and for example, may include at least one of silicon oxide, silicon nitride, and silicon oxynitride.

The interlayer insulation film 40 may be formed on the substrate 100. The interlayer insulation film 40 may include at least one of, for example, silicon oxide, silicon nitride and silicon oxynitride. The interlayer insulation film 40 may be a single layer or multi-layers.

The first contact plug 50 may be formed in the interlayer insulation film 40 to be electrically connected with the first source/drain region 30*a*. The first contact plug 50 may include a conductive material, and for example, may include at least one of polycrystalline silicon, a metal silicide compound, conductive metal nitride, and metal, although the present inventive concept is not limited thereto.

The bit line 60 may be formed on the first contact plug 50 to be electrically connected with the first contact plug 50. The bit line 60 may include a conductive material, and, for example, may include at least one of polycrystalline silicon, a metal silicide compound, conductive metal nitride, and metal. However, the present inventive concept is not limited thereto.

The second contact plug 70 may be formed in the interlayer insulation film 40 to extend through the interlayer insulation film 40. The second contact plug 70 may be electrically connected with the second source/drain region 30*b*. The second contact plug 70 may include a storage node contact.

The second contact plug 70 may include a conductive material, and for example, may include at least one of polycrystalline silicon, a metal silicide compound, conductive metal nitride, and metal. However, the present inventive concept is not limited thereto.

The second contact plug 70 may be electrically connected with a lower electrode (e.g., an electrode of capacitor) that is formed on the second contact plug 70 and has a cylindrical or pillar shape.

The core-peri region includes a first gate structure 1100, a second gate structure 1200, a recrystallization region 500, an etch-stop film 600, an interlayer insulation film 700, a contact 710, and a channel region 920.

The first gate structure 1100 may be formed to be extended in a second direction Y. In some embodiments, the first gate structure 1100 may extend longitudinally in the second direction Y. The first gate structure 1100 may include a gate insulation film 1001, a first conductive film 1002, a second conductive film 1003, a third conductive film 1004, a capping film 1005, and a first gate stack insulation film 1111.

The gate insulation film 1001, the first conductive film 1002, the second conductive film 1003, the third conductive film 1004, and the capping film 1005 may be sequentially stacked on the channel region 920 of the substrate 100 and may extend in the second direction Y.

Specifically, the gate insulation film 1001 may be formed on the channel region 920 of the substrate 100. The gate insulation film 1001 may include, for example, silicon oxide, although the present inventive concept is not limited thereto.

The first conductive film 1002 may be formed on the gate insulation film 1001. The first conductive film 1002 may include, for example, poly silicon, although the present inventive concept is not limited thereto.

The second conductive film 1003 may be formed on the first conductive film 1002. The second conductive film 1003 may include, for example, TiSiN, although the present inventive concept is not limited thereto.

The third conductive film 1004 may be formed on the second conductive film 1003. The third conductive film 1004 may include, for example, tungsten (W), although the present inventive concept is not limited thereto.

The capping film 1005 may be formed on the third conductive film 1004. The capping film 1005 may include, for example, silicon nitride, although the present inventive concept is not limited thereto.

In some embodiments, the first gate stack insulation film 1111 may conformally formed to cover an upper surface and a sidewall of a gate stack that includes the gate insulation film 1001, the first conductive film 1002, the second conductive film 1003, the third conductive film 1004, and the capping film 1005, as illustrated in FIG. 2. It will be understood that "A layer is conformally formed to cover B" means "A layer is formed to have a uniform thickness along a surface of B." Further, it will be understood that "A layer covers B layer" means "A layer partially or completely covers B layer."

The first gate stack insulation film 1111 may include, for example, silicon nitride, although the present inventive concept is not limited thereto.

In some embodiments, a high-k dielectric film and/or at least one work function adjustment film may be formed between the gate insulation film 1001 and the first conductive film 1002.

The high-k dielectric film may include, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof, although the present inventive concept is not limited thereto.

The at least one work function adjustment film may include, for example, tungsten (W), tantalum (Ta), aluminum (Al), ruthenium (Ru), platinum (Pt), titanium nitride (TiN), tantalum nitride (TaN), titanium carbide (TiC), tantalum carbide (TaC), Al$_2$O$_3$/TiN, Al$_2$O$_3$/TaN, Al/TiN, Al/TaN, TiN/Al/TiN, TaN/Al/TaN, TiN/TiON, TaN/TiON, Ta/TiN, TaN/TiN, Mg/TiN, TiN/Mg/TiN, La/TiN, TiN/La/TiN, Sr/TiN, TiN/Sr/TiN, or a combination thereof, although the present inventive concept is not limited thereto.

The second gate structure 1200 may be formed to be spaced apart from the first gate structure 1100 in a first direction X and may extend in the second direction Y. The second gate structure 1200 may include a gate insulation film 1001, a first conductive film 1002, a second conductive film 1003, a third conductive film 1004, a capping film 1005, and a second gate stack insulation film 1121.

The second gate structure 1200 may have the substantially same structure as the first gate structure 1100. That is, the second gate structure 1200 may include a gate stack in which the gate insulation film 1001, the first conductive film 1002, the second conductive film 1003, the third conductive film 1004, and the capping film 1005 are sequentially stacked on the channel region 920 of the substrate 100, and the second gate stack insulation film 1121 that is conformally formed to cover an upper surface and a sidewall of the gate stack.

However, in some embodiments, the second gate structure 1200 may have a different structure from the first gate structure 1100.

The recrystallization region 500 may be formed in the substrate 100 on both sides of the first gate structure 1100 and on both sides of the second gate structure 1200. The recrystallization region 500 may be an amorphous region when it is formed and then the recrystallization region 500 may be recrystallized through an annealing process. The annealing process may crystallize portions of the substrate 100 (e.g., first impurity regions 200 and second impurity regions 300 discussed below), which became amorphous by ion implantation processes.

The channel region 920 may be formed under a lower portion of the first gate structure 1100 and under a lower portion of the second gate structure 1200. The channel region 920 may be formed in the substrate 100 between the recrystallization regions 500.

The recrystallization region 500 may include a stacking fault 510 formed along the (111) crystal plane. For example, a stacking fault plane of the stacking fault 510 is the (111) crystal plane. In some embodiments, the stacking fault 510 may extends from a lower surface 500a of the recrystallization region 500, adjacent to the first gate structure 1100, to have an acute angle θ with the lower surface 500a of the recrystallization region 500, as illustrated in FIG. 2.

In some embodiments, the recrystallization region may include a stacking fault that extends from a lower portion of the recrystallization region, which is adjacent to the gate structure, as illustrated in FIG. 2. The stacking fault may form an acute angle with a lower surface of the recrystallization region.

The stacking fault 510 may distort a lattice of the recrystallization region 500 and may influence a coupling length. For example, the stacking fault 510 may reduce an interatomic coupling length by causing a tensile stress by distorting the lattice of the recrystallization region 500.

By reducing an interatomic distance of the channel region 920 by inducing a stress in the channel region 920 in the process of forming the stacking fault 510, charge carrier mobility in the channel region 920 may be increased. This will be described in greater detail below.

The etch-stop film 600 may be formed to cover the first gate structure 1100, the second gate structure 1200, and an upper surface of the recrystallization region 500.

The etch-stop film 600 may include at least one of, for example, silicon nitride (SiN), silicon oxynitride (SiON), silicon carbonitride (SiCN), silicon oxycarbonitride (SiOCN), silicon oxycarbide (SiOC), and a low-k dielectric material, although the present inventive concept is not limited thereto.

The interlayer insulation film 700 may be formed to cover the etch-stop film 600. The contact 710 may be formed on the recrystallization region 500 to penetrate through the interlayer insulation film 700 and the etch-stop film 600. A portion of the contact 710 may be formed to be buried into an upper portion of the recrystallization region 500, as illustrated in 2.

The contact 710 may be a direct contact plug (DCCP) that is formed to be extended in a third direction Z. The contact 710 may include, for example, tungsten (W), although the present inventive concept is not limited thereto.

Hereinbelow, a method of fabricating a semiconductor device according to some embodiments will be described with reference to FIG. 3 to FIG. 13.

FIG. 3 to FIG. 13 are cross-sectional views illustrating a method of fabricating a semiconductor device according to some embodiments of the present inventive concept.

Figure 3:
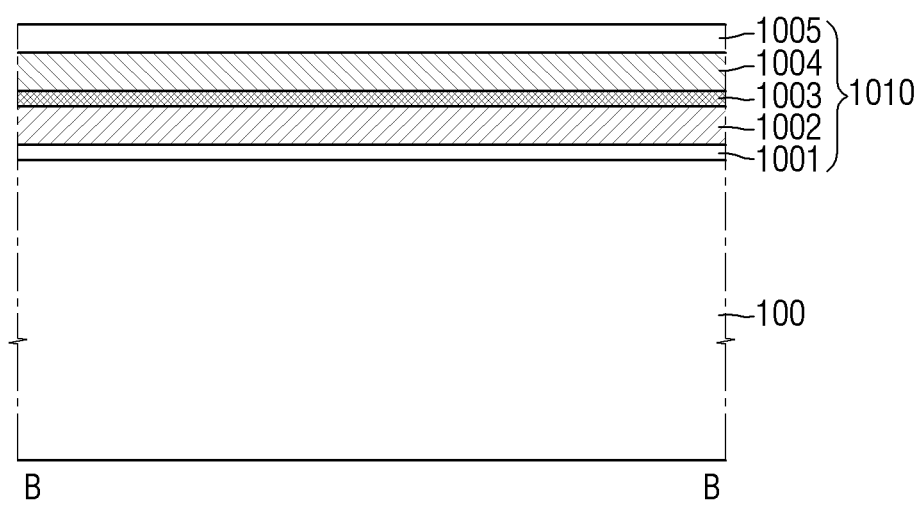
FIG. 3 to FIG. 13 are cross-sectional views illustrating a method of fabricating a semiconductor device according to some embodiments of the present inventive concept.

Referring to FIG. 3, a stacking structure 1010 may be formed on the second region R2 of the substrate 100 forming the core-peri region.

Specifically, the stacking structure 1010 in which the gate insulation film 1001, the first conductive film 1002, the second conductive film 1003, the third conductive film 1004 including tungsten (W), and the capping film 1005 are sequentially stacked on the second region R2 of the substrate 100.

Figure 4:
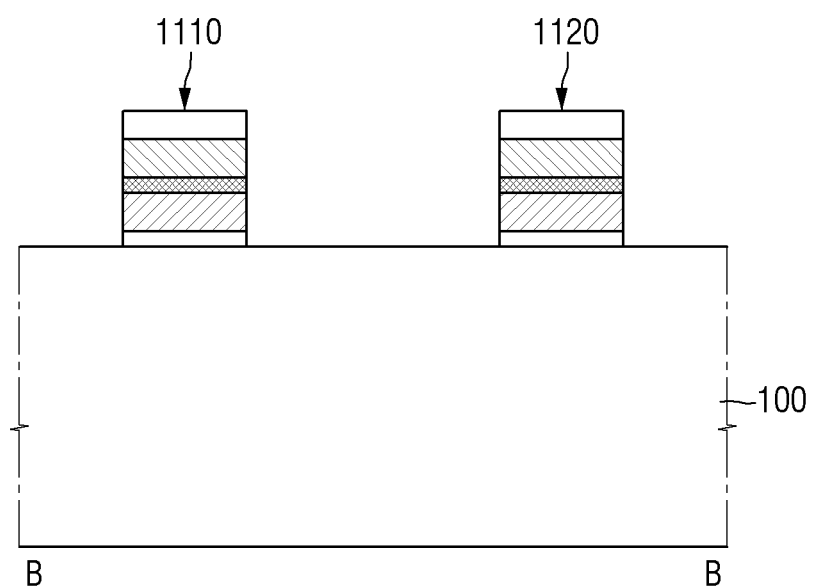

Referring to FIG. 4, a first gate stack 1110 and a second gate stack 1120 may be formed on the substrate 100 by etching the stacking structure 1010 using a mask.

Each of the first gate stack 1110 and the second gate stack 1120 may include the gate insulation film 1001, the first conductive film 1002, the second conductive film 1003, the third conductive film 1004 including tungsten (W), and the capping film 1005 which are sequentially stacked on the substrate 100.

The first gate stack 1110 and the second gate stack 1120 may be spaced apart from each other in the first direction X, and each of the first gate stack 1110 and the second gate stack 1120 may be formed to be extended in the second direction Y. In some embodiments, each of the first gate stack 1110 and the second gate stack 1120 may extend longitudinally in the second direction Y.

Figure 5:
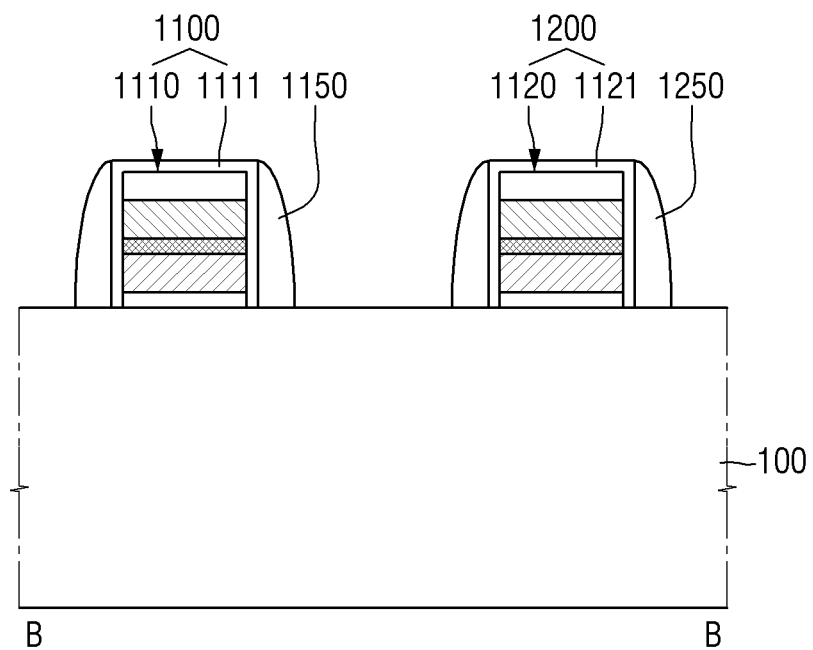

Referring to FIG. 5, the first gate stack insulation film 1111 may be formed to cover an upper surface and a sidewall of the first gate stack 1110, and the second gate stack insulation film 1121 may be formed to cover an upper surface and a sidewall of the second gate stack 1120.

The first gate stack insulation film 1111 and the second gate stack insulation film 1121 may include, for example, silicon nitride, although the present inventive concept is not limited thereto.

Next, a first gate spacer 1150 may be formed along a sidewall of the first gate structure 1100 including the first gate stack 1110 and the first gate stack insulation film 1111. In addition, a second gate spacer 1250 may be formed along a sidewall of the second gate structure 1200 including the second gate stack 1120 and the second gate stack insulation film 1121.

The first gate spacer 1150 and the second gate spacer 1250 may include, for example, silicon oxide, although the present inventive concept is not limited thereto.

Figure 6:
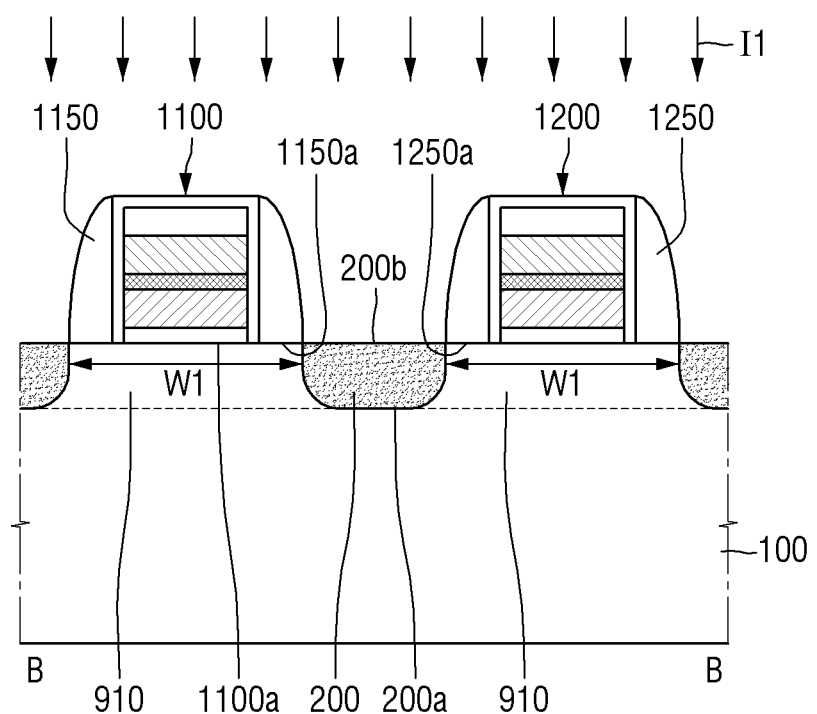

Referring to FIG. 6, a first impurity region 200 which is an amorphous region may be formed in an exposed portion of the substrate 100 by performing a first ion implantation process I1. In some embodiments, a portion of the substrate 100 in which the first impurity region 200 is formed may become amorphous by the first ion implantation process I1.

In some embodiments, the first gate structure 1100, the first gate spacer 1150, the second gate structure 1200, and the second gate spacer 1250 may be used as an ion implantation mask during the first ion implantation process I1, and thus ions may be implanted into portions of the substrate 100 exposed by the first gate structure 1100, the first gate spacer 1150, the second gate structure 1200, and the second gate spacer 1250, as illustrated in FIG. 6.

Specifically, the first impurity region 200 may be formed in the substrate 100 by performing the first ion implantation process I1 on the substrate 100 on which the first gate structure 1100, the first gate spacer 1150, the second gate structure 1200, and the second gate spacer 1250 are not formed. That is, in some embodiments, the first impurity regions 200 may be formed on both sides of the first gate spacer 1150 and on both sides of the second gate spacer 1250, respectively, as illustrated in FIG. 6.

An upper surface 200*b* of the first impurity region 200 may be coplanar with a lower surface 1100*a* of the first gate structure 1100 and a lower surface 1150*a* of the first gate spacer 1150. However, the present inventive concept is not limited thereto.

A first channel region 910 having a first width W1 in the first direction X may be formed in a portion of the substrate 100 that is under the first gate structure 1100 and is between the first impurity regions 200. In addition, the first channel region 910 having the first width W1 in the first direction X may be formed in a portion of the substrate 100 that is under the second gate structure 1200 and is between the first impurity regions 200.

In some embodiments, lightly doped drain (LDD) and a source/drain (S/D) implant may be applied to the first ion implantation process I1, although the present inventive concept is not limited thereto.

Figure 7:
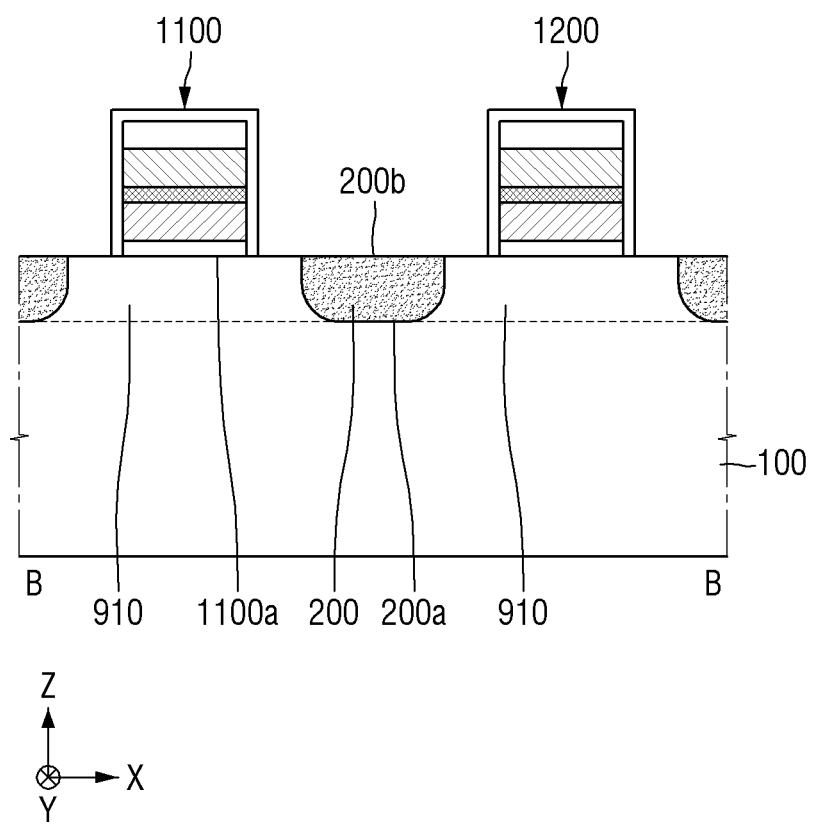

Referring to FIG. 7, the first gate spacer 1150 and the second gate spacer 1250 may be removed.

For example, the first gate spacer 1150 and the second gate spacer 1250 may be wet-etched using an etchant including HF. However, the present inventive concept is not limited thereto.

Figure 8:
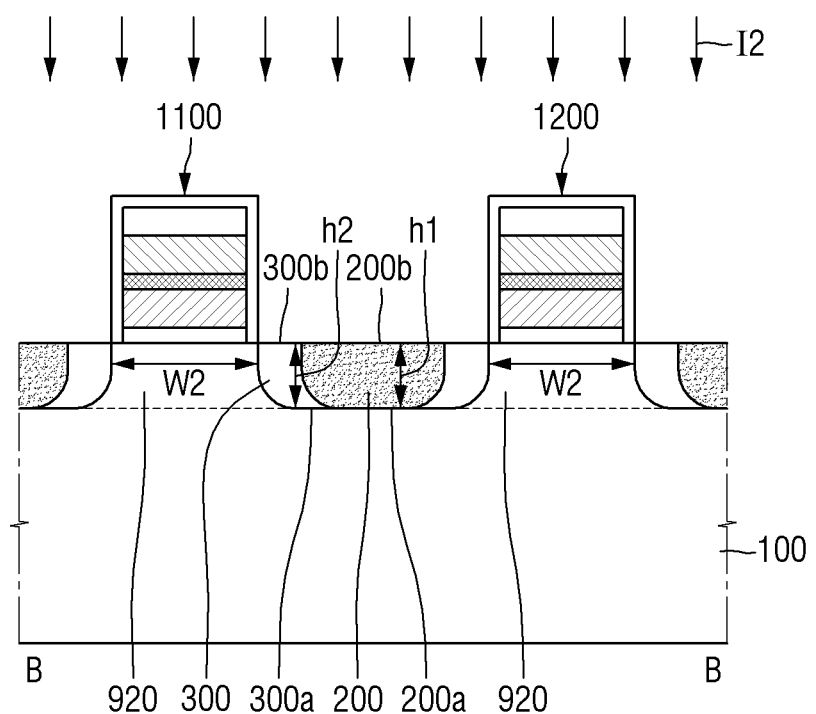

Referring to FIG. 8, second impurity regions 300 that are amorphous regions may be formed in the substrate 100 between the first gate structure 1100 and the first impurity region 200 and between the second gate structure 1200 and the first impurity region 200, by performing a second ion implantation process I2. In some embodiments, portions of the substrate 100 in which the second impurity regions 300 are formed may become amorphous by the second ion implantation process I2.

An upper surface 300*b* of the second impurity region 300 may be coplanar with the upper surface 200*b* of the first impurity region 200.

In some embodiments, the first gate structure 1100 and the second gate structure 1200 may be used as an ion implantation mask during the second ion implantation process I2, and thus ions may be implanted into portions of the substrate 100 exposed by the first gate structure 1100 and the second gate structure 1200 as illustrated in FIG. 8.

In some embodiments, as illustrated in FIG. 8, one of the second impurity regions 300, which is adjacent to the first gate structure 1100, may be formed in a portion of the substrate 100 that was overlapped by the first gate spacer 1150 shown in FIG. 6, and one of the second impurity regions 300, which is adjacent to the second gate structure 1200, may be formed in a portion of the substrate that was overlapped by the second gate spacer 1250 shown in FIG. 6.

In some embodiments, the upper surface 300b of the second impurity region 300 may be an upper surface of the substrate 100 that was overlapped by at least a portion of the lower surface 1150a of the first gate spacer 1150 shown in FIG. 6 before the first gate spacer 1150 is removed. In addition, the upper surface 300b of the second impurity region 300 may be an upper surface of the substrate 100 that was overlapped by at least a portion of a lower surface 1250a of the second gate spacer 1250 shown in FIG. 6 before the second gate spacer 1250 is removed.

A depth of the second impurity region 300 may be adjusted by adjusting process parameters of the second ion implantation process I2. The second impurity region 300 may be formed to have a depth of, for example, about 10 to about 60 nanometers from the upper surface 300b of the second impurity region 300. However, the present inventive concept is not limited thereto.

A first depth h1 from the upper surface 200b of the first impurity region 200 to a lower surface 200a of the first impurity region 200 may be substantially the same as a second depth h2 from the upper surface 300b of the second impurity region 300 to a lower surface 300a of the second impurity region 300. However, the present inventive concept is not limited thereto.

A second channel region 920 having a second width W2 in the first direction X may be formed in a portion of the substrate 100 that is under the first gate structure 1100 and is between the second impurity regions 300. In addition, the second channel region 920 having the second width W2 in the first direction X may be formed in a portion of the substrate 100 that is under the second gate structure 1200 and is between the second impurity regions 300.

The second width W2 of the second channel region 920 may be smaller than the first width W1 of the first channel region 910 shown in FIG. 6.

An ion implant using, for example, at least one of Si, Ge, Ar, Xe, BF$_3$, As, and In may be applied to the second ion implantation process I2, although the present inventive concept is not limited thereto.

Figure 9:
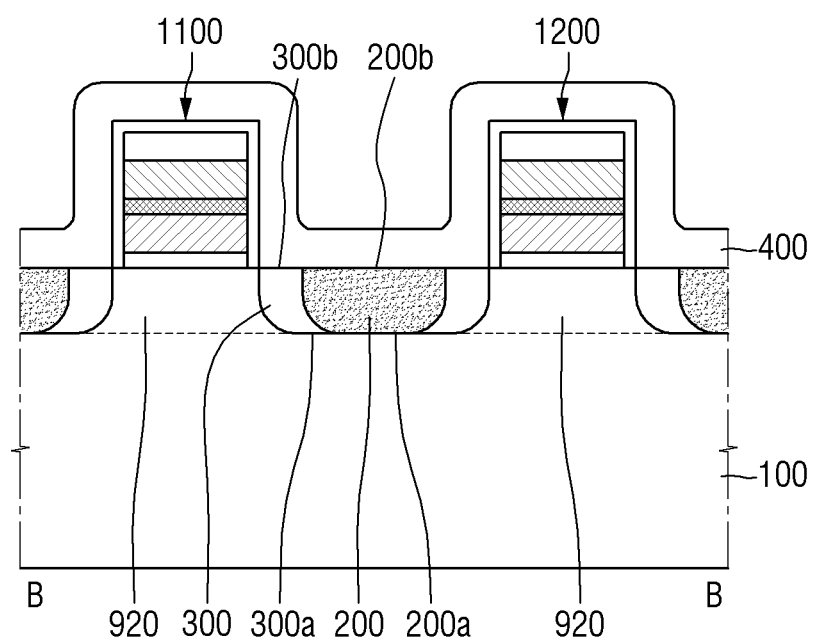

Referring to FIG. 9, a stress film 400 may be formed to cover the first gate structure 1100, the second gate structure 1200, the upper surface 200b of the first impurity region 200, and the upper surface 300b of the second impurity region 300.

The stress film 400 may include, for example, silicon nitride, although the present inventive concept is not limited thereto.

The stress film 400 may be formed to have a thickness of, for example, about 5 to about 50 nanometers, although the present inventive concept is not limited thereto.

Figure 10:
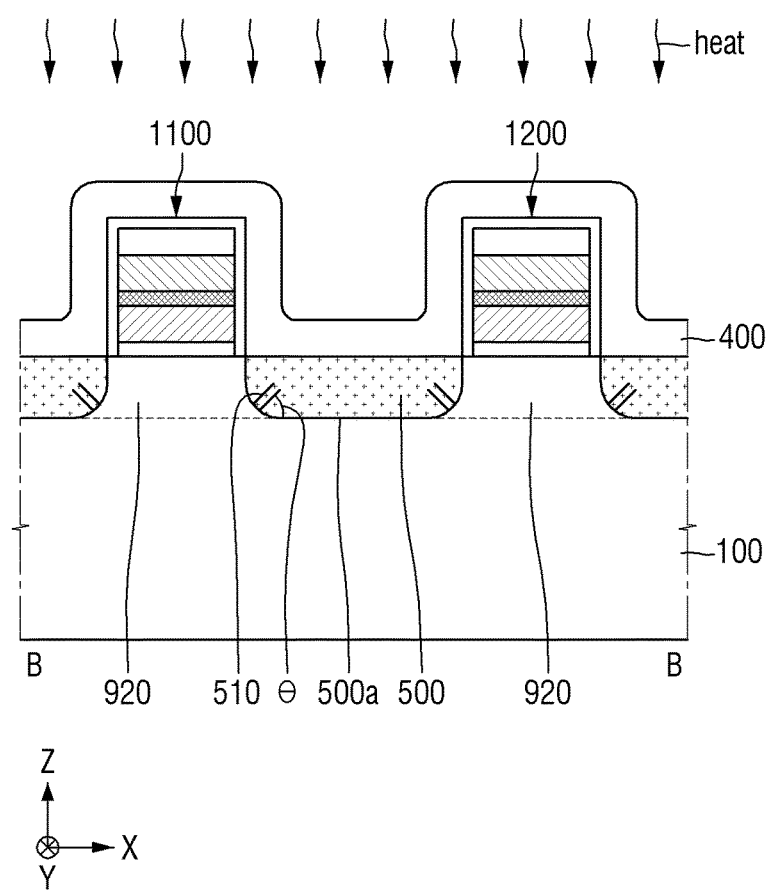

Referring to FIG. 10, the recrystallization region 500 may be formed by performing an annealing process (e.g., a heat treatment process).

Specifically, the recrystallization region 500 may be formed by recrystallizing the first impurity region 200 and the second impurity region 300 shown in FIG. 9 by performing an annealing process (e.g., a heat treatment process).

The annealing process may include, for example, any one of spike RTA, flash RTP, and laser anneal, although the present inventive concept is not limited thereto.

Growth of the recrystallized lattice may occur under a stress condition caused by the stress film 400, and, as a result, the recrystallized recrystallization region 500 may be formed. The recrystallization region 500 includes the stacking fault 510 formed along the (111) crystal plane. For example, a stacking fault plane of the stacking fault 510 is the (111) crystal plane.

In some embodiments, the stacking fault 510 may be extended to go further away from the second channel region 920 as it becomes closer to the upper surface of the recrystallization region 500, as illustrated in FIG. 10.

Although FIG. 10 depicts that the stacking fault 510 starts from a boundary between the recrystallization region 500 and the second channel region 920, the present inventive concept is not limited thereto. That is, in some embodiments, the stacking fault 510 may start from a portion of the inside of the recrystallization region 500, which is spaced apart from the boundary between the recrystallization region 500 and the second channel region 920.

Figure 11:
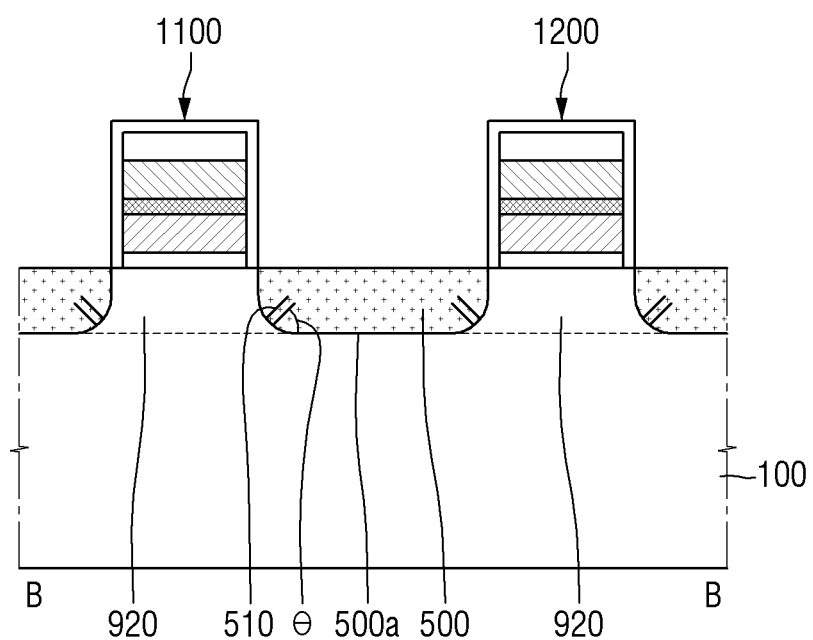

Referring to FIG. 11, the stress film 400 shown in FIG. 10 may be removed.

The recrystallization region 500 may memorize the stress caused by the stress film 400 shown in FIG. 10. Accordingly, the structure of the recrystallization region 500 including the stacking fault 510 may be maintained when the stress film 400 is removed.

Figure 12:
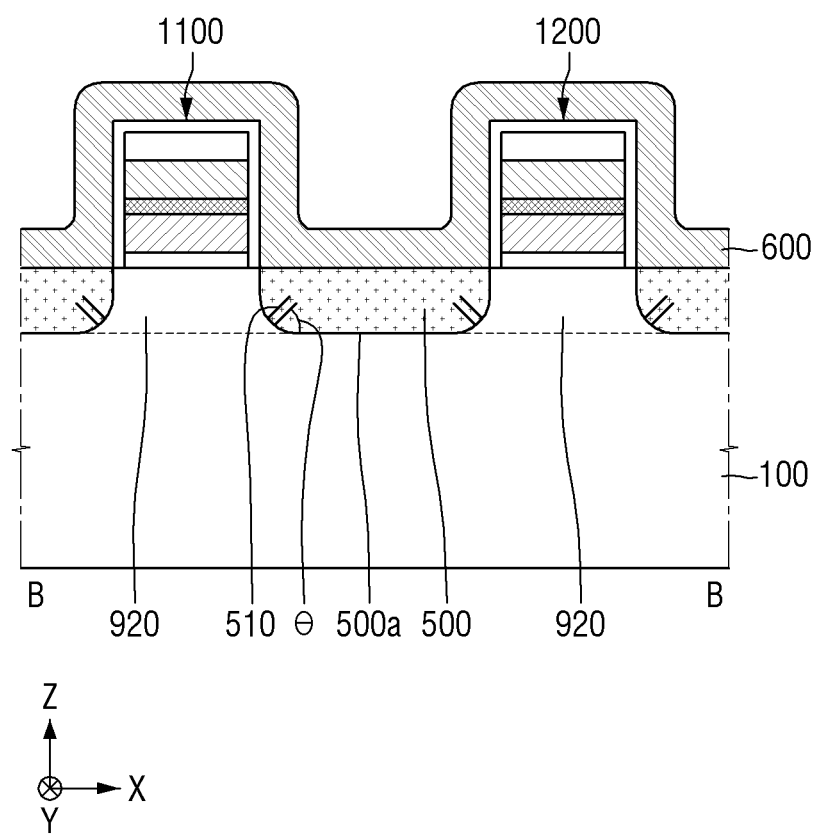

Referring to FIG. 12, the etch-stop film 600 may be formed to cover the first gate structure 1100, the second gate structure 1200, and the upper surface of the recrystallization region 500.

Figure 13:
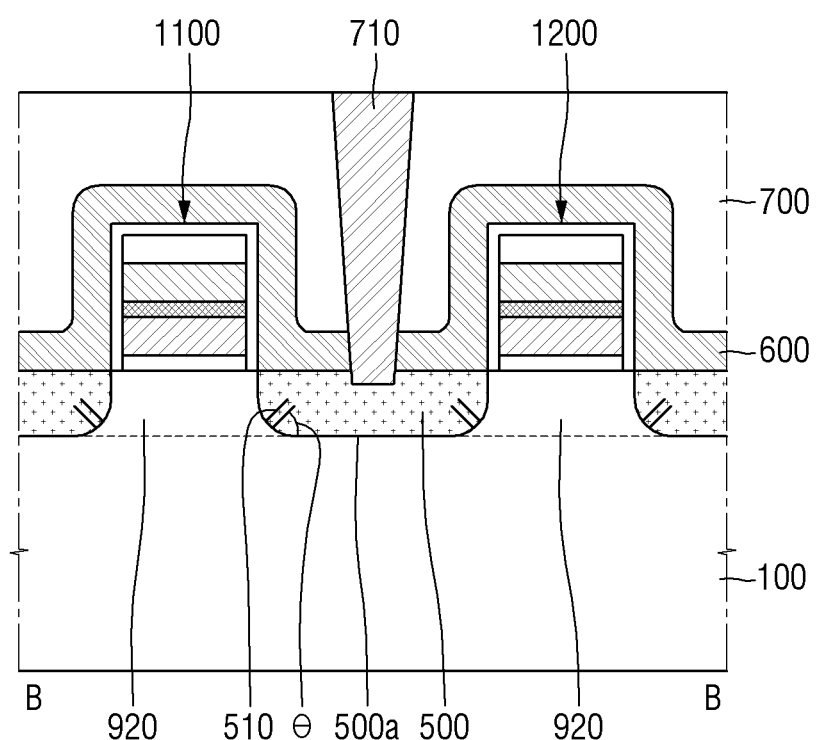

Referring to FIG. 13, the interlayer insulation film 700 may be formed to cover the etch-stop film 600.

Next, a trench may be formed on the recrystallization region 500 to penetrate through the interlayer insulation film 700, the etch-stop film 600, and a portion of the recrystallization region 500. Next, the contact 710 may be formed in the trench.

A semiconductor device according to some embodiments may be fabricated through the above-described fabrication method.

The fabrication method of the semiconductor device according to some embodiments may enhance the performance of a semiconductor device by applying stress memorization technique (SMT), which forms the recrystallization region 500 in the substrate 100 by using the stress film 400 in the transistor formed in the core-peri region of the DRAM.

In addition, the fabrication method of the semiconductor device according to some embodiments may enhance the performance of the semiconductor device by reducing the width of the second channel region 920 by performing an additional ion implantation process (e.g., the second ion implantation process I2) after removing the first and second gate spacers 1150, 1250.

Hereinafter, a method of fabricating a semiconductor device according to some embodiments will be described with reference to FIG. 14. Differences from the method illustrated in FIG. 3 to FIG. 13 will be highlighted.

Figure 14:
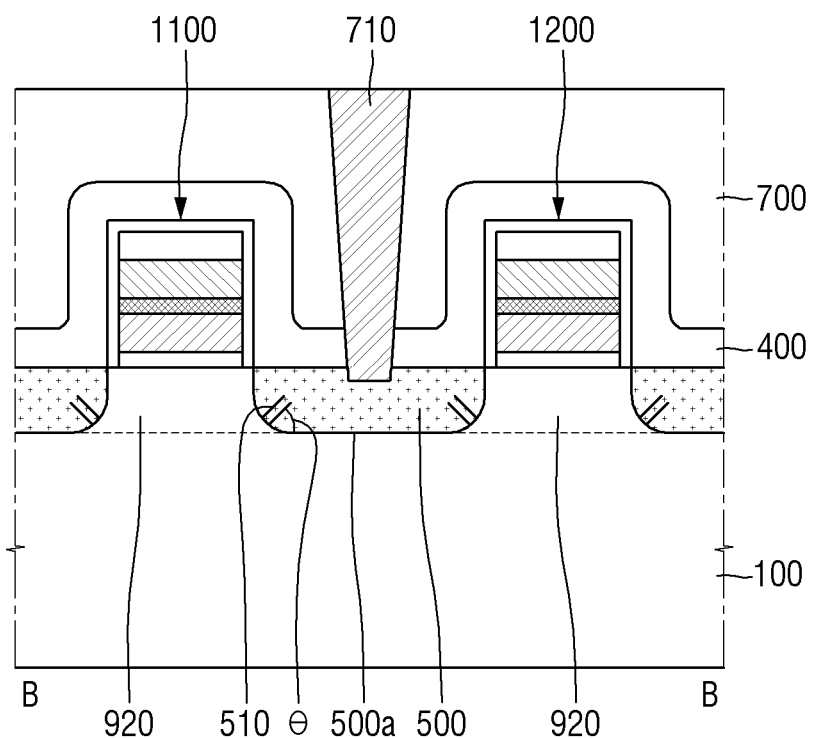
FIG. 14 is a cross-sectional view illustrating a method of fabricating a semiconductor device according to some embodiments of the present inventive concept.

FIG. 14 is a cross-sectional view illustrating a method of fabricating a semiconductor device according to some embodiments of the present inventive concept.

Referring to FIG. 14, the interlayer insulation film 700 may be formed to cover the stress film 400 after the annealing process (e.g., a heat treatment process) illustrated in FIG. 10 is performed.

Next, a trench may be formed on the recrystallization region 500 to penetrate through the interlayer insulation film 700, the stress film 400, and a portion of the recrystallization region 500. Next, the contact 710 may be formed in the trench.

Hereinbelow, a method of fabricating a semiconductor device according to some embodiments will be described with reference to FIG. 15 to FIG. 17. Differences from the method illustrated in FIG. 3 to FIG. 13 will be highlighted.

Figure 15:
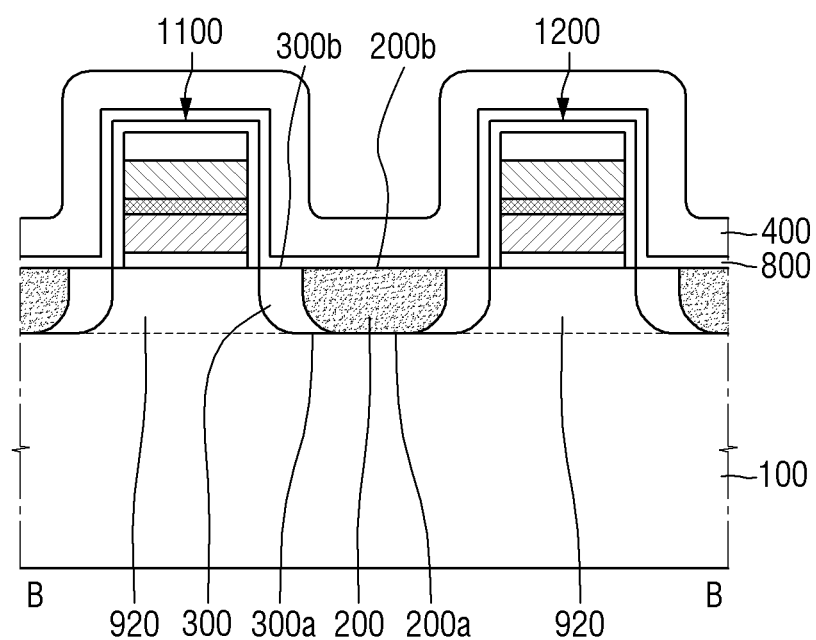
FIG. 15 to FIG. 17 are cross-sectional views illustrating a method of fabricating a semiconductor device according to some embodiments of the present inventive concept.
Figure 16:
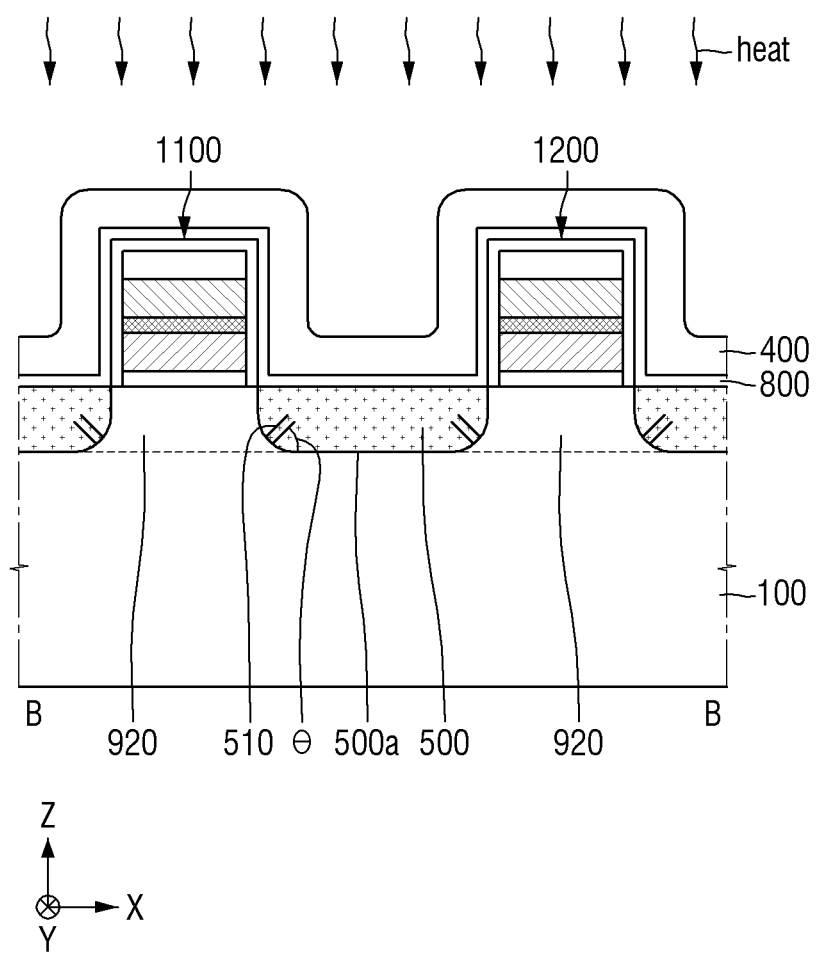
Figure 17:
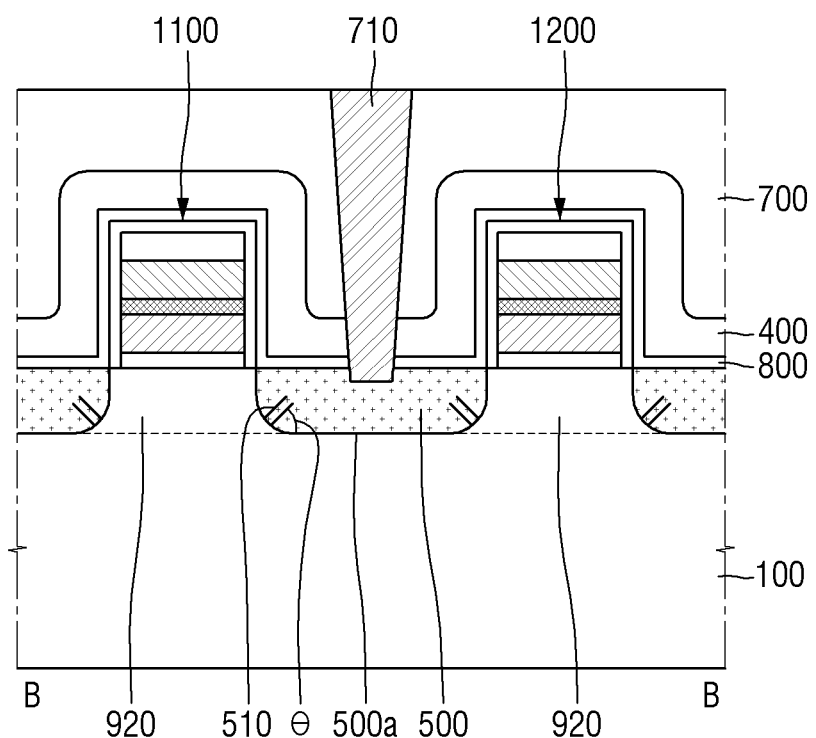

FIG. 15 to FIG. 17 are cross-sectional views illustrating a method of fabricating a semiconductor device according to some embodiments of the present inventive concept.

Referring to FIG. 15, after the second ion implantation process I2 illustrated in FIG. 8 is performed, a gate structure insulation film 800 may be formed to cover the first gate structure 1100, the second gate structure 1200, the upper surface 200b of the first impurity region 200, and the upper surface 300b of the second impurity region 300.

Next, the stress film 400 may be formed to cover the gate structure insulation film 800.

Referring to FIG. 16, the recrystallization region 500 may be formed in the substrate 100 by recrystallizing the first impurity region 200 shown in FIG. 15 and the second impurity region 300 shown in FIG. 15 by performing an annealing process (e.g., a heat treatment process).

Referring to FIG. 17, the interlayer insulation film 700 may be formed to cover the stress film 400.

Next, a trench may be formed on the recrystallization region 500 to penetrate through the interlayer insulation film 700, the stress film 400, the gate structure insulation film 800, and a portion of the recrystallization region 500. Next, the contact 710 may be formed in the trench.

Hereinbelow, a method of fabricating a semiconductor device according to some embodiments will be described with reference to FIG. 15 and FIG. 16 and FIG. 11 to FIG. 13. Difference from the method illustrated in FIG. 3 to FIG. 13 will be highlighted.

After the second ion implantation process I2 illustrated in FIG. 8 is performed, the gate structure insulation film 800 may be formed to cover the first gate structure 1100, the second gate structure 1200, the upper surface 200b of the first impurity region 200, and the upper surface 300b of the second impurity region 300.

Next, the stress film 400 may be formed to cover the gate structure insulation film 800.

Referring to FIG. 16, the recrystallization region 500 may be formed in the substrate 100 by recrystallizing the first impurity region 200 and the second impurity region 300 by performing the annealing process (e.g., a heat treatment process).

Referring back to FIG. 11, the stress film 400 and the gate structure insulation film 800 may be removed after the annealing process (e.g., a heat treatment process) illustrated in FIG. 16 is performed.

Referring back to FIG. 12, the etch-stop film 600 may be formed to cover the first gate structure 1100, the second gate structure 1200, and the upper surface of the recrystallization region 500.

Referring back to FIG. 13, the interlayer insulation film 700 may be formed to cover the etch-stop film 600.

Next, a trench may be formed on the recrystallization region 500 to penetrate through the interlayer insulation film 700, the etch-stop film 600, and a portion of the recrystallization region 500. Next, the contact 710 may be formed in the trench.

Hereinbelow, a method of fabricating a semiconductor device according to some embodiments will be described with reference to FIG. 18 and FIG. 19. The differences from the method illustrated in FIG. 3 to FIG. 13 will be highlighted.

Figure 18:
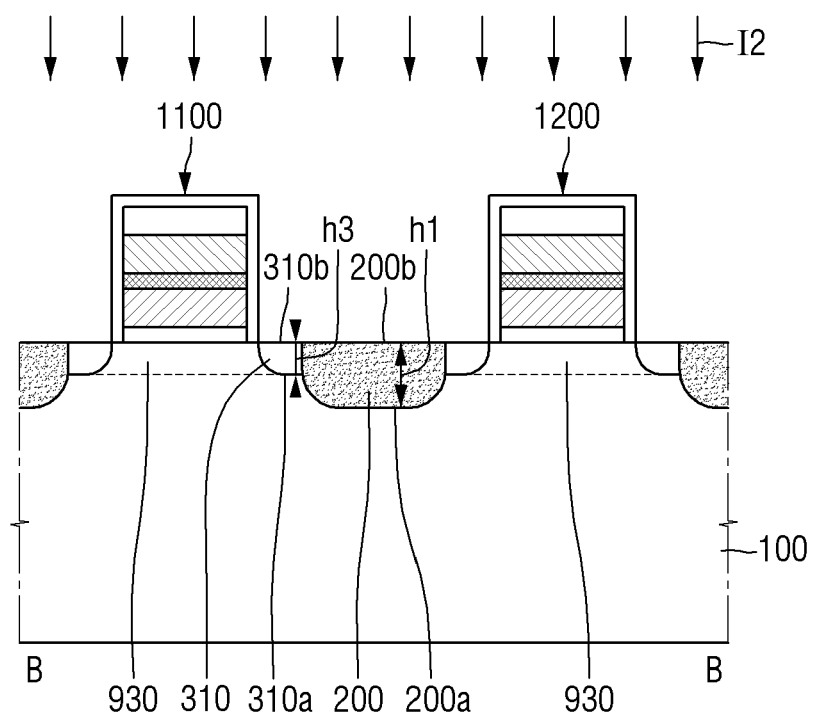

FIG. 18 and FIG. 19 are cross-sectional views illustrating a method of fabricating a semiconductor device according to some embodiments of the present inventive concept.

Referring to FIG. 18, the second ion implantation process I2 may be performed after the first gate spacer 1150 shown in FIG. 6 and the second gate spacer 1250 shown in FIG. 6 are removed as shown in FIG. 7.

Through the second ion implantation process I2, the second impurity region 310 which is an amorphous region may be formed in the substrate 100 between the first gate structure 1100 and the first impurity region 200 and between the second gate structure 1200 and the first impurity region 200.

The second impurity region 310 may have a third depth h3 from the upper surface 310b of the second impurity region 310 to the lower surface 310a of the second impurity region 310. In this case, the third depth h3 of the second impurity region 310 may be smaller than the first depth h1 of the first impurity region 200.

Referring to FIG. 19, the recrystallization region 501 may be formed in the substrate 100 by recrystallizing the first impurity region 200 shown in FIG. 18 and the second impurity region 300 shown in FIG. 18 by performing an annealing process (e.g., a heat treatment process).

Example embodiments according to the present inventive concept were explained herein with reference to the drawings attached, but it should be understood that the present inventive concept is not limited to the aforementioned example embodiments, but may be fabricated in various different forms, and may be implemented by a person skilled in the art in other specific forms without altering the technical concept or essential characteristics of the present inventive concept. Accordingly, it will be understood that the example embodiments described above are only illustrative, and should not be construed as limiting. The appended claims are intended to cover all modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, the method comprising:
forming a gate structure on a core-peri region of a substrate, wherein the substrate further comprises a cell region, and the gate structure comprises a conductive film and a gate stack insulation film that comprises a side portion contacting a sidewall of the conductive film and a top portion extending on an upper surface of the conductive film;
forming a gate spacer on a sidewall of the gate structure;
forming a first impurity region adjacent the gate spacer in the core-peri region of the substrate by performing a first ion implantation process;
removing the gate spacer;
forming a second impurity region in the core-peri region of the substrate between the gate structure and the first impurity region by performing a second ion implantation process;
forming a stress film on the gate structure, an upper surface of the first impurity region, and an upper surface of the second impurity region, wherein the stress film contacts the side portion and the top portion of the gate stack insulation film; and forming a recrystallization region by crystallizing the first impurity region and the second impurity region by performing an annealing process.

2. The method of claim 1, further comprising:
removing the stress film after forming the recrystallization region;
forming an etch-stop film on the gate structure and an upper surface of the recrystallization region;
forming an interlayer insulation film on the etch-stop film; and
forming a contact on the recrystallization region, wherein the contact extends through the interlayer insulation film and the etch-stop film.

3. The method of claim 1, further comprising:
forming an interlayer insulation film on the stress film after forming the recrystallization region; and
forming a contact on the recrystallization region, wherein the contact extends through the interlayer insulation film and the stress film.

4. The method of claim 1, further comprising:
forming a gate structure insulation film on the gate structure, the upper surface of the first impurity region, and the upper surface of the second impurity region; and
forming the stress film on the gate structure insulation film.

5. The method of claim 1, wherein forming the gate structure comprises:
forming a stack structure on the core-peri region of the substrate; and
forming a gate stack by etching the stack structure.

6. The method of claim 5, wherein forming the stack structure comprises:
forming a gate insulation film on the core-peri region of the substrate;
forming the conductive film comprising:
forming a first conductive film on the gate insulation film;
forming a second conductive film on the first conductive film; and
forming a third conductive film on the second conductive film, the third conductive film comprising tungsten (W); and
forming a capping film on the third conductive film.

7. The method of claim 1, wherein the gate stack insulation film comprises silicon nitride, and the gate spacer comprises silicon oxide.

8. The method of claim 1, wherein a first depth from the upper surface of the first impurity region to a lower surface of the first impurity region is equal to a second depth from the upper surface of the second impurity region to a lower surface of the second impurity region.

9. The method of claim 1, wherein the recrystallization region comprises a stacking fault that extends from a lower portion of the recrystallization region, and the lower portion of the recrystallization region is adjacent to the gate structure, and
wherein the stacking fault forms an acute angle with a lower surface of the recrystallization region.

10. The method of claim 1, wherein the second impurity region is formed in a portion of the core-peri region of the substrate, and
wherein a stacking fault is formed within the portion of the core-peri region of the substrate by the annealing process.

11. A method of fabricating a semiconductor device, the method comprising:

forming a gate structure on a core-peri region of a substrate, wherein the substrate further comprises a cell region, and the gate structure comprises a conductive film and a gate stack insulation film that comprises a side portion contacting a sidewall of the conductive film and a top portion extending on an upper surface of the conductive film;
forming gate spacers on opposing sidewalls of the gate structure;
forming first impurity regions in the core-peri region of the substrate by performing a first ion implantation process, wherein each of the first impurity regions is adjacent to a respective one of the gate spacers, wherein the first impurity regions define a first channel region in the core-peri region of the substrate between the first impurity regions, and wherein the first channel region has a first width;
removing the gate spacers;
forming second impurity regions in the core-peri region of the substrate by performing a second ion implantation process, wherein each of the second impurity regions is adjacent to a respective one of the opposing sidewalls of the gate structure, wherein the second impurity regions define a second channel region in the core-peri region of the substrate between the second impurity regions, and wherein the second channel region has a second width narrower than the first width;
forming a stress film on the gate structure, upper surfaces of the first impurity regions, and upper surfaces of the second impurity regions, wherein the stress film contacts the side portion and the top portion of the gate stack insulation film; and
forming a recrystallization region by crystallizing the first impurity regions and the second impurity regions by performing an annealing process.

12. The method of claim 11, further comprising:
forming a gate structure insulation film on the gate structure, the upper surfaces of the first impurity regions, and the upper surfaces of the second impurity regions; and
forming the stress film on the gate structure insulation film.

13. The method of claim 12, further comprising:
removing the stress film and the gate structure insulation film after forming the recrystallization region;
forming an etch-stop film on the gate structure and an upper surface of the recrystallization region;
forming an interlayer insulation film on the etch-stop film; and
forming a contact on the recrystallization region, wherein the contact extends through the interlayer insulation film and the etch-stop film.

14. The method of claim 12, further comprising:
forming an interlayer insulation film on the stress film after forming the recrystallization region; and
forming a contact on the recrystallization region, wherein the contact extends through the interlayer insulation film, the stress film, and the gate structure insulation film.

15. The method of claim 11, wherein a first depth from the upper surface of one of the first impurity regions to a lower surface of the one of the first impurity regions is larger than a second depth from the upper surface of one of the second impurity regions to a lower surface of the one of the second impurity regions.

16. The method of claim 11, wherein the recrystallization region comprises a stacking fault that extends from a lower portion of the recrystallization region, and the lower portion of the recrystallization region is adjacent to the gate structure, and wherein the stacking fault forms an acute angle with a lower surface of the recrystallization region.

17. A method of fabricating a semiconductor device, the method comprising:

forming a first gate structure and a second gate structure on a core-peri region of a substrate, wherein the first gate structure and the second gate structure are spaced apart from each other in a first direction, and wherein the substrate further comprises a cell region, and the first gate structure comprises a conductive film and a gate stack insulation film that comprises a side portion contacting a sidewall of the conductive film and a top portion extending on an upper surface of the conductive film;

forming a first gate spacer on a sidewall of the first gate structure and forming a second gate spacer on a sidewall of the second gate structure;

forming a first impurity region in the core-peri region of the substrate between the first gate spacer and the second gate spacer by performing a first ion implantation process;

removing the first gate spacer and the second gate spacer;

forming second impurity regions in a first portion and a second portion of the core-peri region of the substrate by performing a second ion implantation process, wherein the first portion of the core-peri region of the substrate is between the first gate structure and the first impurity region, and the second portion of the core-peri region of the substrate is between the second gate structure and the first impurity region;

forming a stress film on the first gate structure, the second gate structure, an upper surface of the first impurity region, and upper surfaces of the second impurity regions, wherein the stress film contacts the side portion and the top portion of the gate stack insulation film of the first gate structure; and forming a recrystallization region by crystallizing the first impurity region and the second impurity regions by performing an annealing process.

18. The method of claim 17, further comprising:

forming an interlayer insulation film on the stress film after forming the recrystallization region; and forming a contact on the recrystallization region, wherein the contact extends through the interlayer insulation film and the stress film.

19. The method of claim 17, wherein the first portion of the core-peri region of the substrate comprises a portion of the core-peri region of the substrate overlapped by the first gate spacer, and the second portion of the core-peri region of the substrate comprises a portion of the core-peri region overlapped by the second gate spacer.

20. The method of claim 17, wherein removing the first gate spacer and the second gate spacer comprises etching the first gate spacer and the second gate spacer by performing a wet-etching process using HF as an etchant.

* * * * *